(12) United States Patent
Lee et al.

(10) Patent No.: US 11,965,939 B2
(45) Date of Patent: Apr. 23, 2024

(54) ELECTRONIC DEVICE COMPENSATING FOR GEOMAGNETIC SENSING DATA AND METHOD FOR CONTROLLING THE SAME

(71) Applicant: Samsung Electronics Co., Ltd., Gyeonggi-do (KR)

(72) Inventors: Hyeonggeon Lee, Gyeonggi-do (KR); Taeyoon Kim, Gyeonggi-do (KR); Youngpo Lee, Gyeonggi-do (KR); Dukhyun Chang, Gyeonggi-do (KR); Chaiman Lim, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 172 days.

(21) Appl. No.: 17/718,590

(22) Filed: Apr. 12, 2022

(65) Prior Publication Data

US 2022/0326317 A1    Oct. 13, 2022

Related U.S. Application Data

(63) Continuation of application No. PCT/KR2022/002593, filed on Feb. 22, 2022.

(30) Foreign Application Priority Data

Apr. 12, 2021  (KR) .................. 10-2021-0046942

(51) Int. Cl.
  *G01R 33/02*    (2006.01)
  *G01R 33/00*    (2006.01)
(52) U.S. Cl.
  CPC ..... *G01R 33/0206* (2013.01); *G01R 33/0082* (2013.01)
(58) Field of Classification Search
  CPC . G01R 33/0206; G01R 33/0082; G01C 17/38
  (Continued)

(56) References Cited

U.S. PATENT DOCUMENTS 4,746,859 A    5/1988 Malik
4,929,899 A    5/1990 Weixelman et al.
(Continued)

FOREIGN PATENT DOCUMENTS

JP   2012-18081 A    1/2012
JP   2013-120538 A   6/2013
(Continued)

OTHER PUBLICATIONS

Translation of KR20050074642 (Year: 2005).*
(Continued)

*Primary Examiner* — Christopher P McAndrew
(74) *Attorney, Agent, or Firm* — Cha & Reiter, LLC

(57) ABSTRACT

Disclosed are an electronic device for compensating for geomagnetic sensing data and a method for controlling the same. According to an embodiment of the disclosure, an electronic device may include a processor configured to store, in a memory, a temperature of each of a plurality of heating areas and a variation in a geomagnetic value sensed by a geomagnetic sensor, perform linear fitting using the temperature and the variation in the geomagnetic value, compute an error between the variation in the geomagnetic value and an estimated value for the variation in the geomagnetic value, based on a result of the linear fitting, determine a scheme for compensating for the geomagnetic value based on the computed error, and compensate for the geomagnetic value sensed by the geomagnetic sensor using the determined scheme when a variation in temperature is detected for at least one heating area in the plurality of heating areas.

17 Claims, 11 Drawing Sheets

(58) Field of Classification Search
USPC .......................................................... 324/252
See application file for complete search history.

(56) References Cited

U.S. PATENT DOCUMENTS

| | | | |
|---|---|---|---|
| 5,608,317 | A | 3/1997 | Hollmann |
| 6,421,622 | B1 | 7/2002 | Horton et al. |
| 2003/0094942 | A1* | 5/2003 | Friend .................... G01C 17/30 324/244 |
| 2004/0104724 | A1 | 6/2004 | Sato |
| 2005/0283988 | A1* | 12/2005 | Sato ....................... G01C 17/38 33/356 |
| 2006/0097721 | A1 | 5/2006 | Sato |
| 2006/0168832 | A1 | 8/2006 | Yasui et al. |
| 2012/0086442 | A1 | 4/2012 | Haas et al. |
| 2012/0098525 | A1 | 4/2012 | Snow et al. |
| 2013/0124126 | A1 | 5/2013 | Ahuja et al. |
| 2013/0124127 | A1 | 5/2013 | Ahuja et al. |
| 2014/0184211 | A1 | 7/2014 | Fujita et al. |
| 2015/0285835 | A1 | 10/2015 | Karahan et al. |
| 2016/0252589 | A1 | 9/2016 | Raman et al. |
| 2016/0273915 | A1* | 9/2016 | Kitamura ............... G01C 17/38 |
| 2019/0033347 | A1 | 1/2019 | Takano et al. |
| 2020/0292570 | A1 | 9/2020 | Palella et al. |

FOREIGN PATENT DOCUMENTS

| | | |
|---|---|---|
| JP | 2015-92528 A | 5/2015 |
| KR | 10-2005-0074642 A | 7/2005 |
| KR | 10-0698414 B1 | 3/2007 |
| KR | 10-1301462 B1 | 8/2013 |
| KR | 10-2014-0136119 A | 11/2014 |
| KR | 10-2016-0083888 A | 7/2016 |

OTHER PUBLICATIONS

Brauer, P., et al. "Magnetic calibration of vector magnetometers: linearity, thermal effects and stability." Workshop on calibration of space-borne magnetometers, TU-Braunschweig. 1999. (Year: 1999).*
International Search Report dated Jun. 10, 2022.

* cited by examiner

| Heating area #1 | | | | | | |
|---|---|---|---|---|---|---|
| Temperature | MagX | | MagY | | MagZ | |
| | Increase | Decrease | Increase | Decrease | Increase | Decrease |
| 34 | | | | | | |
| 35 | | | | | | |
| 36 | +0.8 | | | | | |
| 37 | +1.0 | | | | | |

FIG.4C

ELECTRONIC DEVICE COMPENSATING FOR GEOMAGNETIC SENSING DATA AND METHOD FOR CONTROLLING THE SAME

CROSS-REFERENCE TO RELATED APPLICATION(S)

This application is a continuation of International Application No. PCT/KR2022/002593, filed on Feb. 22, 2022, in the Korean Intellectual Property Receiving Office, and claiming priority to Korean Patent Application No. 10-2021-0046942, filed on Apr. 12, 2021, in the Korean Intellectual Property Office, the disclosure of which is incorporated by reference herein its entirety.

BACKGROUND

Technical Field

One or more embodiments of the instant disclosure generally relates to an electronic device for compensating for geomagnetic sensing data and a method for controlling the same.

Description of Related Art

More and more services and functions are being provided through electronic devices, e.g., smartphones, or other portable electronic devices. To meet the needs of various users and raise use efficiency of these electronic devices, communication service carriers or device manufacturers have been competing to develop electronic devices with various different functionalities. Accordingly, various functions that are provided through electronic devices are evolving more and more.

SUMMARY

One conventional method for compensating for geomagnetic sensing data is to initially measure compensation data during development or manufacture of the electronic device (e.g., before a geomagnetic sensor is mounted in the electronic device) and use the initially measured compensation data to compensate for geomagnetic sensing data. However, compensating for geomagnetic sensing data in this way requires specialized equipment for measuring temperature changes and geomagnetic sensing data of the electronic device when developing the geomagnetic sensor for the electronic device. Further, in the process of actually compensating for the geomagnetic sensing data, significant compensation error may occur due to environmental differences between when the geomagnetic sensing data is actually compensated and when the compensation data is initially measured.

According to an embodiment of the disclosure, an electronic device may comprise a memory, a geomagnetic sensor, and at least one processor configured to store, in the memory, a temperature of each of a plurality of heating areas included in the electronic device and a variation in a geomagnetic value sensed by the geomagnetic sensor, corresponding to the temperature, perform linear fitting using the temperature and the variation in the geomagnetic value stored in the memory, compute an error between the variation in the geomagnetic value and an estimated value for the variation in the geomagnetic value, based on a result of the linear fitting, determine a scheme for compensating for the geomagnetic value based on the computed error, and compensate for the geomagnetic value sensed by the geomagnetic sensor using the determined scheme when a variation in temperature is detected for at least one heating area in the plurality of heating areas.

According to an embodiment of the disclosure, an electronic device may comprise a memory, a geomagnetic sensor, and at least one processor configured to perform linear fitting using a temperature of each of a plurality of heating areas previously stored in the memory and a variation in a geomagnetic value sensed by the geomagnetic sensor, compute an error between the variation in the geomagnetic value and an estimated value for the variation in the geomagnetic value, based on a result of the linear fitting, determining a scheme for compensating for the geomagnetic value based on the computed error, and compensate for the geomagnetic value sensed by the geomagnetic sensor using the determined scheme when a variation in temperature is detected for at least one heating area in the plurality of heating areas.

According to an embodiment of the disclosure, a method for controlling an electronic device may comprise storing, in a memory, a temperature of each of a plurality of heating areas constituting the electronic device and a variation in a geomagnetic value sensed by a geomagnetic sensor, corresponding to the temperature, performing linear fitting using the temperature and the variation in the geomagnetic value stored in the memory, computing an error between the variation in the geomagnetic value and an estimated value for the variation in the geomagnetic value, based on a result of the linear fitting, determining a scheme for compensating for the geomagnetic value based on the computed error, and compensating for the geomagnetic value sensed by the geomagnetic sensor using the determined scheme when a variation in temperature is detected for at least one heating area in the plurality of heating areas.

Additional aspects will be set forth in part in the description which follows and, in part, will be apparent from the description, or may be learned by practice of the presented embodiments.

BRIEF DESCRIPTION OF THE DRAWINGS

The above and other aspects, features, and advantages of certain embodiments of the present disclosure will be more apparent from the following description taken in conjunction with the accompanying drawings, in which:

FIGS. 4A to 4C are example views illustrating a function or operation of generating a temperature compensation table using a variation in the geomagnetic value obtained while an electronic device is used according to an embodiment of the disclosure;

DETAILED DESCRIPTION

According to an embodiment of the disclosure, there may be provided an electronic device capable of compensating for geomagnetic sensing data even without prior information related to the mounted geomagnetic sensor by compensating for geomagnetic sensing data based on variations in geomagnetic sensing data measured while using the electronic device.

According to an embodiment of the disclosure, there may be provided an electronic device capable of precise compensation as different compensation equations are applied to each of the axes of the geomagnetic sensor.

According to an embodiment of the disclosure, there may be provided an electronic device providing highly reliable compensation performance of geomagnetic sensing data by identifying the compensation performance and updating data stored in the electronic device when the compensation performance is lowered.

Figure 1:
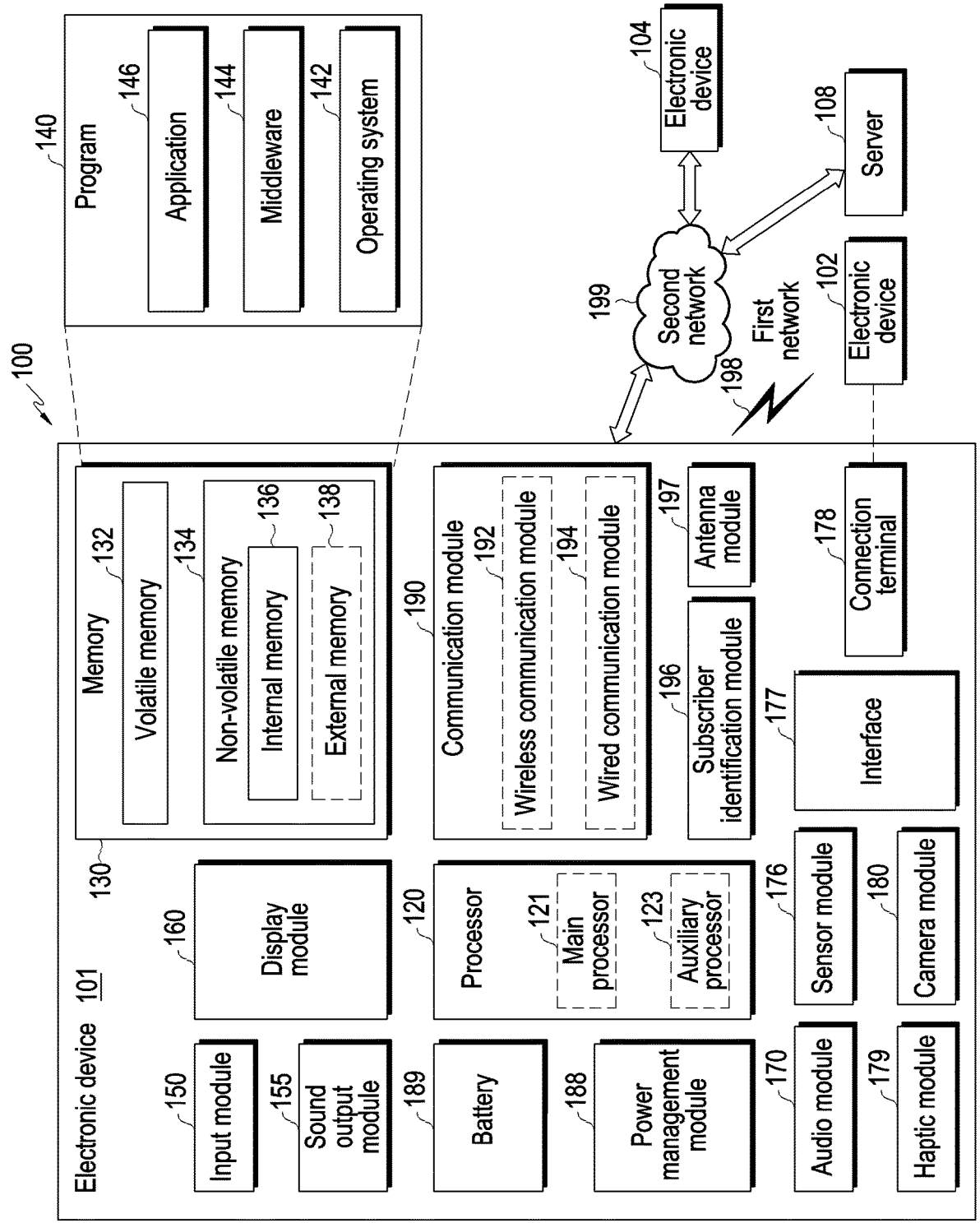
FIG. 1 is a block diagram illustrating an electronic device in a network environment according to an embodiment.

FIG. 1 is a block diagram illustrating an electronic device 101 in a network environment 100 according to an embodiment. Referring to FIG. 1, the electronic device 101 in the network environment 100 may communicate with at least one of an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one (e.g., the connecting terminal 178) of the components may be omitted from the electronic device 101, or one or more other components may be added in the electronic device 101. According to an embodiment, some (e.g., the sensor module 176, the camera module 180, or the antenna module 197) of the components may be integrated into a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be configured to use lower power than the main processor 121 or to be specified for a designated function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. The artificial intelligence model may be generated via machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted Boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by other component (e.g., the processor 120) of the electronic device 101, from the outside (e.g., a user) of the electronic device 101. The input module 150 may include, for example, a microphone, a mouse, a keyboard, keys (e.g., buttons), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display 160 may include, for example, a display, a hologram device, or a projector and control circuitry to control a corresponding one of the display, hologram device, and projector. According to an embodiment, the display 160 may include a touch sensor configured to detect a touch, or a pressure sensor configured to measure the intensity of a force generated by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or motion) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device 104 via a first network 198 (e.g., a short-range communication network, such as Bluetooth™, wireless-fidelity (Wi-Fi) direct, or infrared data association (IrDA)) or a second network 199 (e.g., a long-range communication network, such as a legacy cellular network, a 5G network, a next-generation communication network, the Internet, or a computer network (e.g., local area network (LAN) or wide area network (WAN)). These various types of communication modules may be implemented as a single component (e.g., a single chip), or may be implemented as multi components (e.g., multi chips) separate from each other. The wireless communication module 192 may identify or authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device). According to an embodiment, the antenna module 197 may include one antenna including a radiator formed of a conductor or conductive pattern formed on a substrate (e.g., a printed circuit board (PCB)). According to an embodiment, the antenna module 197 may include a plurality of antennas (e.g., an antenna array). In this case, at least one antenna appropriate for a communication scheme used in a communication network, such as the first network 198 or the second network 199, may be selected from the plurality of antennas by, e.g., the communication module 190. The signal or the power may then be transmitted or received between the communication module 190 and the external electronic device via the selected at least one antenna. According to an embodiment, other parts (e.g., radio frequency integrated circuit (RFIC)) than the radiator may be further formed as part of the antenna module 197.

According to certain embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. The external electronic devices 102 or 104 each may be a device of the same or a different type from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or health-care) based on 5G communication technology or IoT-related technology.

Figure 2:
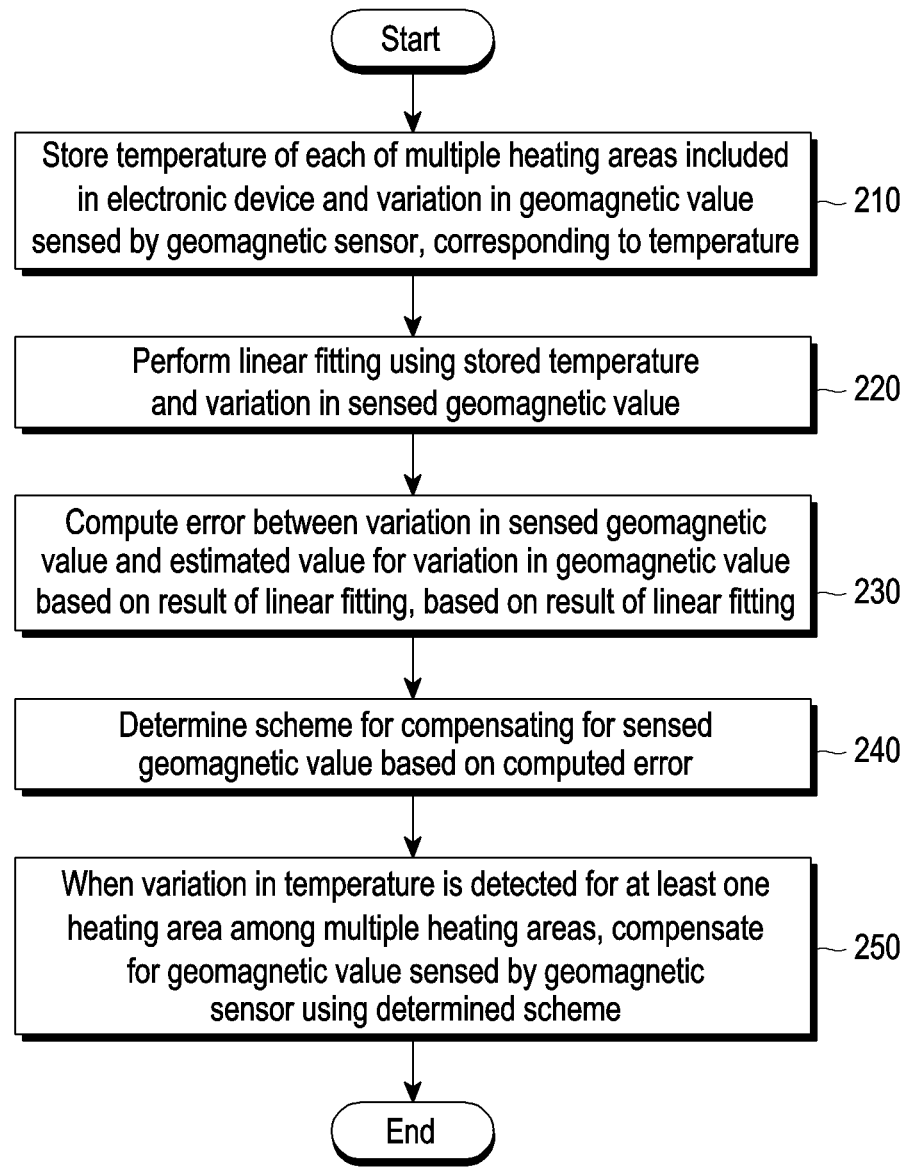
FIG. 2 is a flowchart illustrating a function or operation of compensating for a geomagnetic value using a variation in the geomagnetic value obtained while an electronic device is used according to an embodiment of the disclosure.
Figure 3:
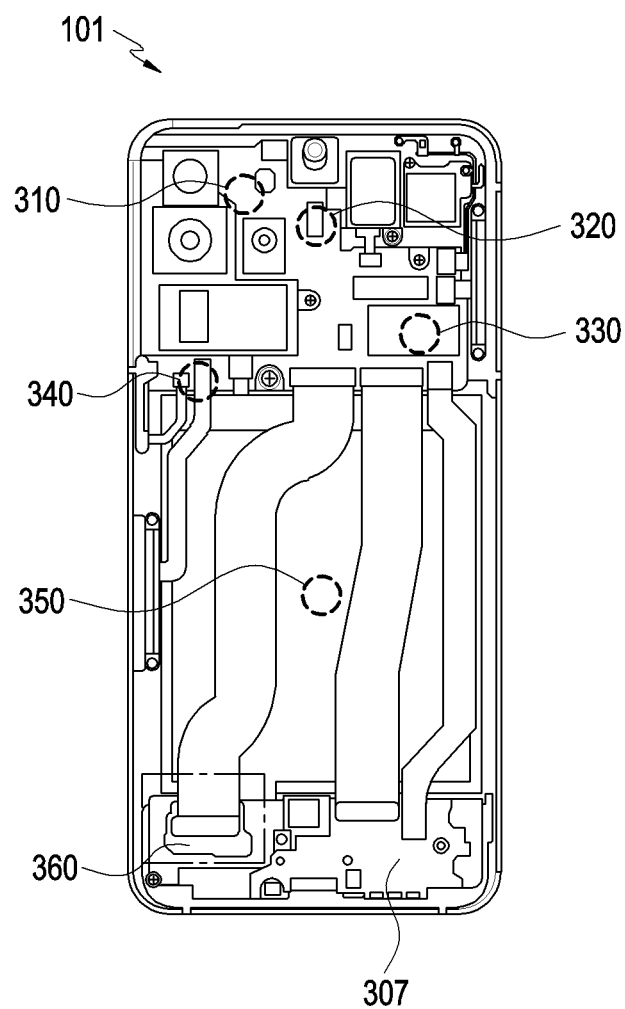
FIG. 3 is an example plan view illustrating a heating area according to an embodiment of the disclosure.
Figure 4A:
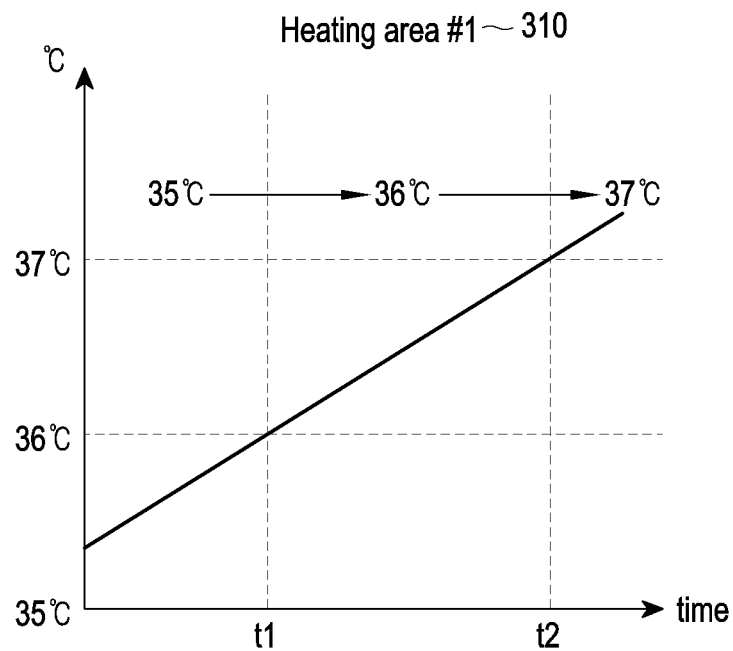
Figure 4B:
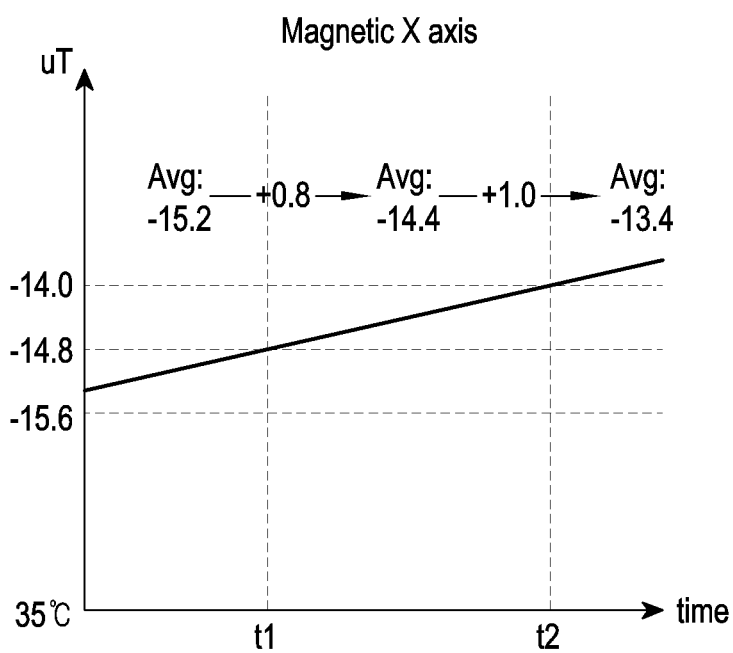
Figure 5A:
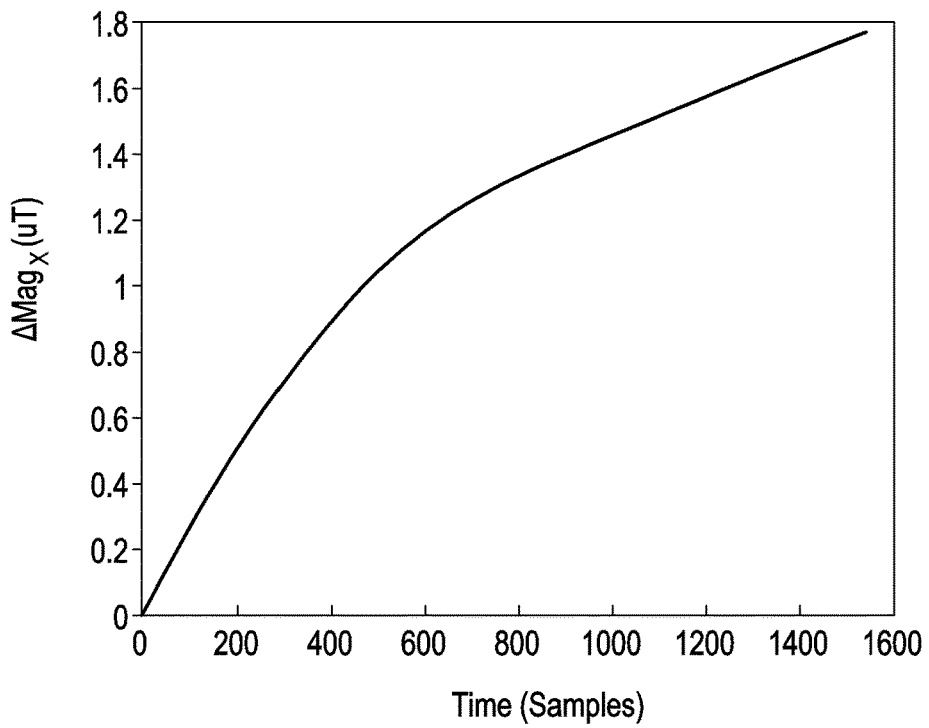
FIGS. 5A to 5C are example views illustrating a function or operation of performing linear fitting according to an embodiment of the disclosure.
Figure 5B:
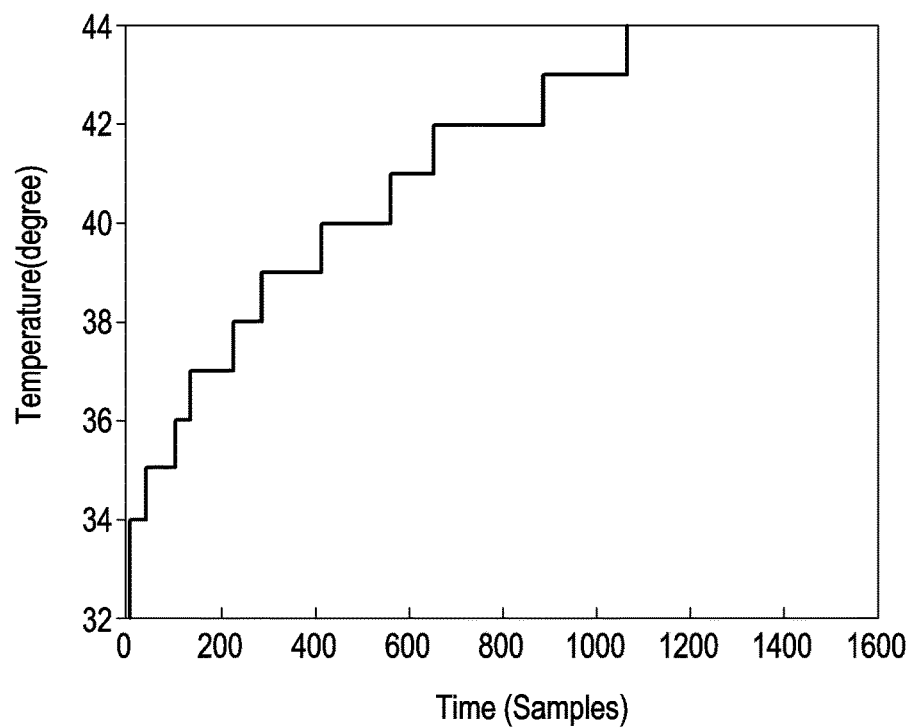
Figure 5C:
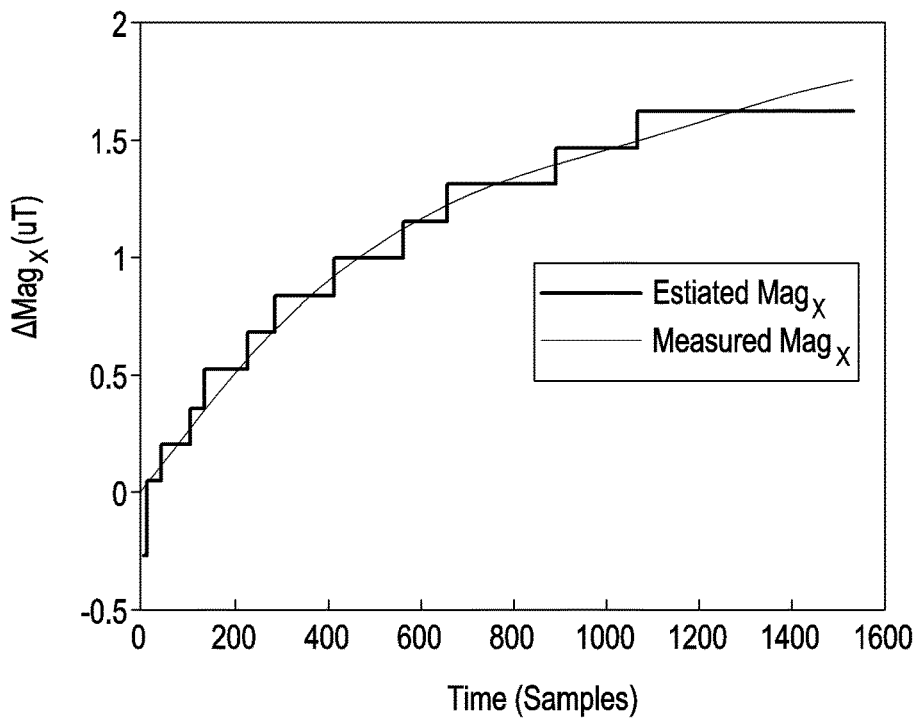
Figure 5D:
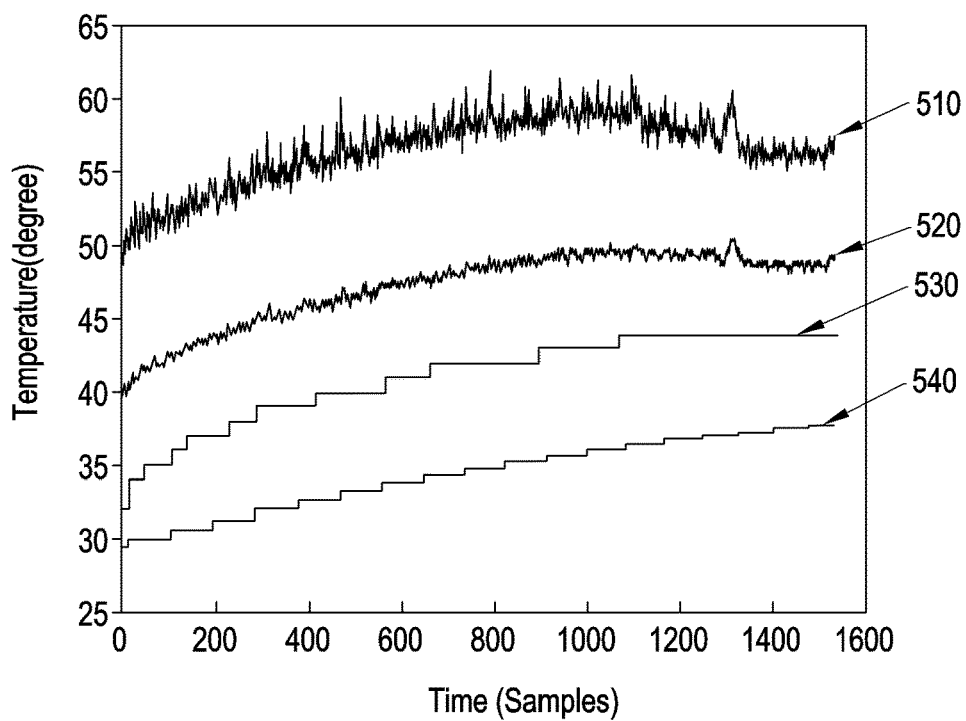
FIGS. 5D and 5E are example views illustrating a heating area excluded from linear fitting according to an embodiment of the disclosure.
Figure 5E:
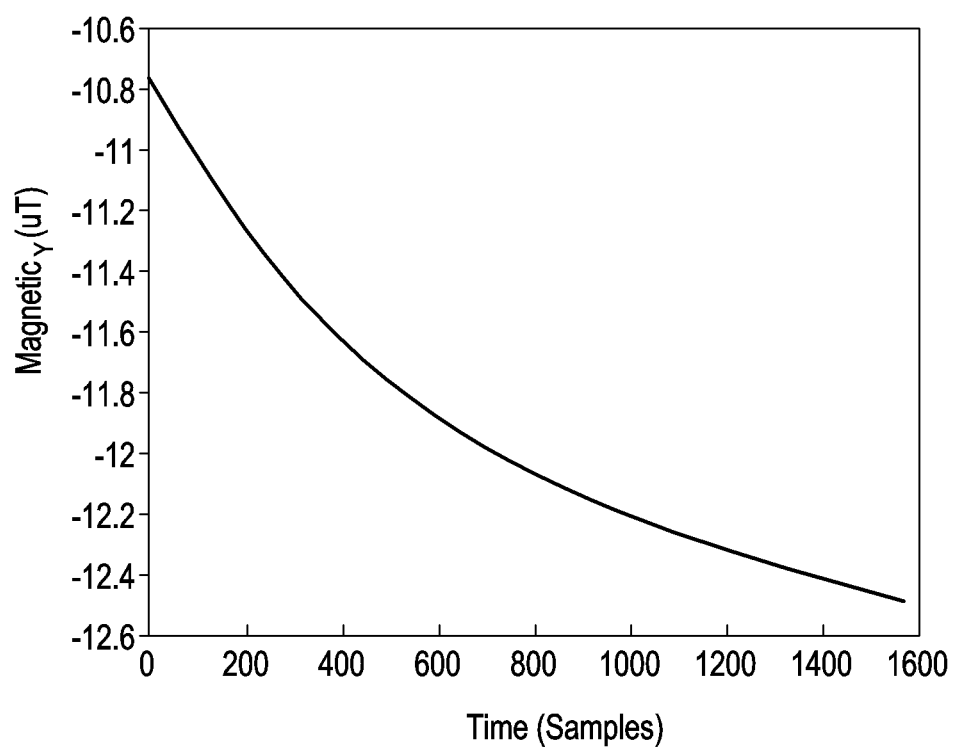
Figure 6:
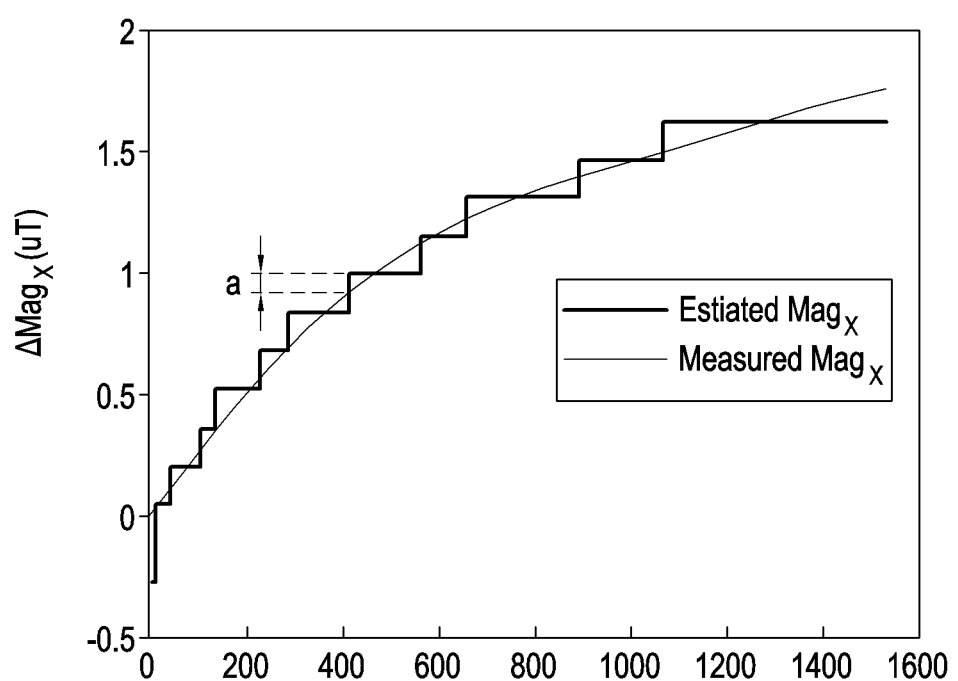
FIG. 6 is an example view illustrating a function or operation of computing an error according to an embodiment of the disclosure.

FIG. 2 is a flowchart illustrating a function or operation of compensating for a geomagnetic value using a variation in the geomagnetic value obtained while an electronic device 101 is used according to an embodiment of the disclosure. FIG. 3 is an example plan view illustrating a heating area according to an embodiment of the disclosure. FIGS. 4A to 4C are example views illustrating a function or operation of generating a temperature compensation table using a variation in the geomagnetic value obtained while an electronic device is used according to an embodiment of the disclosure. FIGS. 5A to 5C are example views illustrating a function or operation of performing linear fitting according to an embodiment of the disclosure. FIGS. 5D and 5E are example views illustrating a heating area excluded from linear fitting according to an embodiment of the disclosure. FIG. 6 is an example view illustrating a function or operation of computing an error according to an embodiment of the disclosure.

Referring to FIG. 2, in operation 210, an electronic device 101 (e.g., the processor 120 of FIG. 1) according to an embodiment of the disclosure may store, in the memory 130, variations in geomagnetic values sensed by a geomagnetic sensor (e.g., the sensor module 176) that individually correspond to a plurality of heating areas (e.g., a first heating area 310, a second heating area 320, a third heating area 330, a fourth heating area 340, a fifth heating area 350, and a sixth heating area 360). Referring to FIG. 3, the plurality of heating areas according to an embodiment of the disclosure may correspond to specific components (e.g., the processor 120, the display module 160, the camera module 180, and/or the battery 189) included in the electronic device 101, from which temperatures may be measured. According to an embodiment of the disclosure, for components disposed adjacent to each other (e.g., components having similar temperature variation values) or components that perform substantially the same function or operation (e.g., a first processor and a second processor if there are a plurality of processors 120), any one of the plurality of components may be determined as a representative heating area. The processor 120 may include a microprocessor or any suitable type of processing circuitry, such as one or more general-purpose processors (e.g., ARM-based processors), a Digital Signal Processor (DSP), a Programmable Logic Device (PLD), an Application-Specific Integrated Circuit (ASIC), a Field-Programmable Gate Array (FPGA), a Graphical Processing Unit (GPU), a video card controller, etc. In addition, it would be recognized that when a general purpose computer accesses code for implementing the processing shown herein, the execution of the code transforms the general purpose computer into a special purpose computer for executing the processing shown herein. Certain of the functions and steps provided in the Figures may be implemented in hardware, software or a combination of both and may be performed in whole or in part within the programmed instructions of a computer. No claim element herein is to be construed under the provisions of 35 U.S.C. 112(f), unless the element is expressly recited using the phrase "means for." In addition, an artisan understands and appreciates that a "processor" or "microprocessor" may be hardware in the claimed disclosure. Under the broadest reasonable interpretation, the appended claims are statutory subject matter in compliance with 35 U.S.C. § 101.

Each of the plurality of heating areas according to an embodiment of the disclosure may include at least one element (e.g., a temperature sensor (thermistor)) capable of measuring variations in temperature. According to another embodiment, the electronic device 101 may further include a separate temperature sensor and measure the temperature of at least one heating area using the separate temperature sensor. The electronic device 101 according to an embodiment of the disclosure may identify the respective temperatures of the plurality of heating areas (e.g., the first heating area 310, the second heating area 320, the third heating area 330, the fourth heating area 340, the fifth heating area 350, and the sixth heating area 360) and variations in geomagnetic value corresponding to the temperatures, thereby generating a table as shown in FIG. 4C. Referring to FIG. 4A, the electronic device 101 according to an embodiment of the disclosure may identify that the temperature of the first heating area 310 changed to 36 degrees at time t1 and changes to 37 degrees at time t2. In this case, in the electronic device 101 according to an embodiment of the disclosure may identify that the geomagnetic value sensed by the sensor module 176 (e.g., a geomagnetic sensor) increases by 0.8 at time t1 and increases by 1.0 at time t2. Accordingly, as illustrated in FIG. 4C, the electronic device 101 according to an embodiment of the disclosure may store, in the memory 130, the variation in geomagnetic value corresponding to changes in temperature for a specific axis (e.g., X axis) of the geomagnetic sensor as an element of the temperature compensation table as shown in FIG. 4C. The temperature compensation table according to an embodiment of the disclosure may be separately generated for each heating area. The temperature compensation table according to an embodiment of the disclosure may include the maximum temperature that the heating area may reach from a base temperature (e.g., the temperature of the heating area when the electronic device is not used for a designated time or longer), and the maximum temperature may be included as an element of the temperature compensation table. The electronic device 101 according to an embodiment of the disclosure may generate a temperature compensation table for each axis of the geomagnetic sensor. Operation 210 according to an embodiment of the disclosure may be performed when the electronic device 101 is in a static state (e.g., when an acceleration value sensed by an acceleration sensor is less than or equal to a predesignated value). For example, the operation may be performed when the electronic device 101 according to an embodiment of the disclosure is stationary on a table while the user is talking on the phone with a counterparty. The temperature values illustrated in FIG. 4C are exemplary, and the interval (e.g., 1 degree as shown in FIG. 4C) between the temperatures may be changed. For example, when the temperature interval is set to 0.5 degrees, the electronic device 101 according to an embodiment of the disclosure may sense the geomagnetic value at 0.5 degree intervals (e.g., 34 degrees, 34.5 degrees, or 35 degrees). The electronic device 101 according to an embodiment of the disclosure may store an average value of geomagnetic values sensed in a specific time period in the temperature compensation table, as shown in FIG. 4B. For example, to remove noise, the electronic device 101 according to an embodiment of the disclosure may store the average value of geomagnetic values sensed at a specific temperature (e.g., 36 degrees) in the temperature compensation table. The average value may be calculated from five geomagnetic values sensed over a period of one minute, for example. Similarly, the electronic device 101 according to an embodiment of the disclosure may store the average value of the measured temperature values in the temperature compensation table. For example, the electronic device 101 according to an embodiment of the disclosure may determine whether the temperature of the heating area increases or decreases using the average temperature value for a unit time period (e.g., 1 minute). According to another embodiment of the disclosure, when the sensed geomagnetic value does not include noise (e.g., when the geomagnetic values detected do not include a variation that is greater than a predetermined value), the sensed geomagnetic value may be stored, as it is, in the temperature compensation table. When the temperature of some (e.g., the first heating area 310 and the second heating area 320) of the plurality of heating areas increases, the electronic device 101 according to an embodiment of the disclosure may store the variation in geomagnetic sensing value for at least one heating area whose temperature is actually increased, as an element of the temperature compensation table. For example, when the temperature interval is designated as 1 degree, if the temperature value of the first heating area 310 increases by 1 degree and the temperature value of the second heating area 320 increases by 0.5 degrees, the heating area whose temperature is substantially increased is the first heating area 301, because its temperature is increased by the designated temperature interval or more. Thus, the electronic device 101 according to an embodiment of the disclosure may store the varied geomagnetic value (e.g., +0.8) in the temperature compensation table of the first heating area 301. If each of the some of the heating areas (e.g., the first heating area 310 and the second heating area 320) has substantial increases in temperature, the electronic device 101 according to an embodiment of the disclosure may store the varied geomagnetic value (e.g., +0.8) in each of the temperature compensation tables of the first heating area 310 and the second heating area 320.

In operation 220, the electronic device 101 according to an embodiment of the disclosure may perform linear fitting using the variations in geomagnetic value and temperatures stored in the memory. Linear fitting according to an embodiment of the disclosure may refer to a method for finding an equation in closest approximation to values of data Y with values of data X when data X and data Y have a relationship that can be represented as a linear equation. For example, when the linear equation is Equation 1 below, the data X is the temperature of the heating area, and the data Y is the variation in geomagnetic value, and linear fitting may be the process for computing value A and value B which minimizes the differences in the variations of the geomagnetic value predicted by the equation and the actual values.

$$Y = AX + B \qquad \text{[Equation 1]}$$

For example, if the actual variation in geomagnetic value is as shown in FIG. 5A, and the variations in the temperature of a specific heating area is as shown in FIG. 5B, the linear equation may be Equation 2, which is the result from linear fitting.

$$Y = 0.15862X - 5.3472 \qquad \text{[Equation 2]}$$

In FIG. 5A, the vertical axis may denote the actual variation in geomagnetic value, and the horizontal axis may denote the time (or when the samples were taken). In FIG. 5B, the vertical axis may denote the temperature of a specific heating area, and the horizontal axis may denote the time (or when the samples were taken). If the Y value (e.g., variation in geomagnetic value) is estimated by inputting the temperature value to X through Equation 2 according to an embodiment of the disclosure, the estimated geomagnetic value may be represented as a thick line 505 of FIG. 5C. For example, the differences between the actually sensed geomagnetic value and the estimated geomagnetic value may be consistent, and it may be determined that the estimated geomagnetic value is correctly predicted through Equation 2 with an acceptable margin of error.

If the disclosure related to the linear fitting described above is applied to an embodiment of the disclosure, the linear fitting according to an embodiment of the disclosure may mean a process of determining C, α, and β in Equations 3 and 4 below when there are two heating areas (e.g., when the electronic device 101 includes the first heating area 310 and the second heating area 320). In Equations 3 and 4 below, $\Delta Mag_x$ may mean the variation in the geomagnetic X-axis value, $T_1$ may mean the temperature value of a specific heating area (e.g., the first heating area 310), and $T_2$ may mean the temperature value of a specific heating area (e.g., the second heating area 320). The electronic device 101 according to an embodiment of the disclosure may perform linear fitting to determine C, α, and β for each axis (e.g., X-axis, Y-axis, and Z-axis) of the geomagnetic sensor. C according to an embodiment of the disclosure may be a constant derived as a result from performing linear fitting, and α and β may be coefficients derived as results from performing linear fitting.

$$\Delta Mag_x = C + \alpha T_1 \quad \text{[Equation 3]}$$

$$\Delta Mag_x = C + \alpha T_1 + \beta T_2 \quad \text{[Equation 4]}$$

The electronic device 101 according to an embodiment of the disclosure may determine C, α, and β using linear fitting. However, for heating areas whose temperature variations and geomagnetic value variations have different tendencies, the electronic device 101 according to an embodiment of the disclosure may not perform linear fitting for those heating areas while performing linear fitting for heating areas whose variations have consistent tendencies. For example, referring to FIG. 5D, the temperature distribution 510 of the first heating area 310 and the temperature distribution 520 of the second heating area 320 have a tendency to both increase and decrease whereas the temperature distribution 530 of the third heating area 330 and the temperature distribution 540 of the fourth heating area 340 have a tendency of only continuously increasing. Further, referring to FIG. 5E, the absolute value of the sensed geomagnetic value has a tendency of continuously increasing, but the sensed geomagnetic value may be increasing in a negative direction. In this case, since the tendency of temperature variation and the tendency of variation in geomagnetic value are consistent only in the third heating area 330 and the fourth heating area 340, linear fitting may be performed using Equation 6, instead of Equation 5, as the equation for linear fitting. For example, since variation tendencies are inconsistent in the first heating area 310 and the second heating area 320, linear fitting may not be performed for the heating area 310 and the second heating area 320. C according to an embodiment of the disclosure may be a constant derived as a result from performing linear fitting, and r and δ may be coefficients derived as results of performing linear fitting. On the other hand, if tendencies in variations the heating area 310 and the second heating area 320 are consistent, then Equation 5 may be used.

$$\Delta Mag_x = C + \alpha T_1 + \beta T_2 + r T_3 + \sigma T_4 \quad \text{[Equation 5]}$$

$$\Delta Mag_x = C + r T_3 + \sigma T_4 \quad \text{[Equation 6]}$$

In operation 230, the electronic device 101 according to an embodiment of the disclosure may compute one or more errors between the sensed variations in geomagnetic value and the estimated values for the variations in geomagnetic value based on the result of linear fitting. The electronic device 101 according to an embodiment of the disclosure may compute the root mean square of the differences between the sensed variations in geomagnetic value and the estimated values for the variations in geomagnetic value based on the result of linear fitting. The electronic device 101 according to an embodiment of the disclosure may compute the error a, as shown in FIG. 6, for each sample and compute the root mean square using the computed error a. The electronic device 101 according to an embodiment of the disclosure may compute the root mean square for each equation (e.g., Equation 3 and Equation 4). For example, when there are two heating areas, the electronic device 101 according to an embodiment of the disclosure may compute a root mean square for the estimated value according to Equation 3 and a root mean square for the estimated value according to Equation 4.

In operation 240, the electronic device 101 according to an embodiment of the disclosure may determine a scheme for compensating for the sensed geomagnetic value based on the computed error. The scheme according to an embodiment of the disclosure may include, e.g., a function or operation of determining an equation for compensating for the geomagnetic value. The electronic device 101 according to an embodiment of the disclosure may determine an equation having the smallest value among the plurality of computed root mean squares, as the compensation equation for compensating for geomagnetic value. For example, in the case where there are two heating areas, the root mean square for the estimated value according to Equation 3 is 0.041, and the root mean square for the estimated value according to Equation 4 is 0.058, the electronic device 101 according to an embodiment of the disclosure may determine Equation 3 having the relatively smaller root mean square as the equation for compensating for geomagnetic value. For example, the electronic device 101 according to an embodiment of the disclosure may determine at least one heating area (e.g., the first heating area 310) for compensating for geomagnetic value based on the size of the root mean square. However, in another embodiment, the electronic device 101 according to an embodiment of the disclosure may compensate for the geomagnetic value using values included in the compensation table generated in operation 210 without generating and/or determining a compensation equation. For example, in the case where at least one heating area for compensating for geomagnetic value is determined as the first heating area 310, if the temperature is substantially varied (e.g., increased from 35 degrees to 36 degrees), the electronic device 101 according to an embodiment of the disclosure may compensate for the sensed geomagnetic value by subtracting 0.8, which is a value included in the compensation table, from the sensed geomagnetic value.

In operation 250, in the case where a variation in temperature is detected for at least one heating area (e.g., the first heating area 310) among the plurality of heating areas, the electronic device 101 according to an embodiment of the disclosure may compensate for the sensed geomagnetic value by the geomagnetic sensor using the equation determined in operation 240. For example, in the case where at least one heating area for compensating for the geomagnetic value is determined as the first heating area 310 (e.g., when the compensation equation is determined as Equation 3), if identifying that the temperature of the first heating area 310 is substantially varied (e.g., when the temperature of the first heating area 310 is varied from 35 degrees to 36 degrees), the electronic device 101 according to an embodiment of the disclosure may compensate for the geomagnetic value sensed by the geomagnetic sensor by subtracting the geomagnetic value $\Delta Mag_x$ (e.g., +0.79) estimated using the determined equation from the geomagnetic value actually sensed by the geomagnetic sensor.

Figure 7:
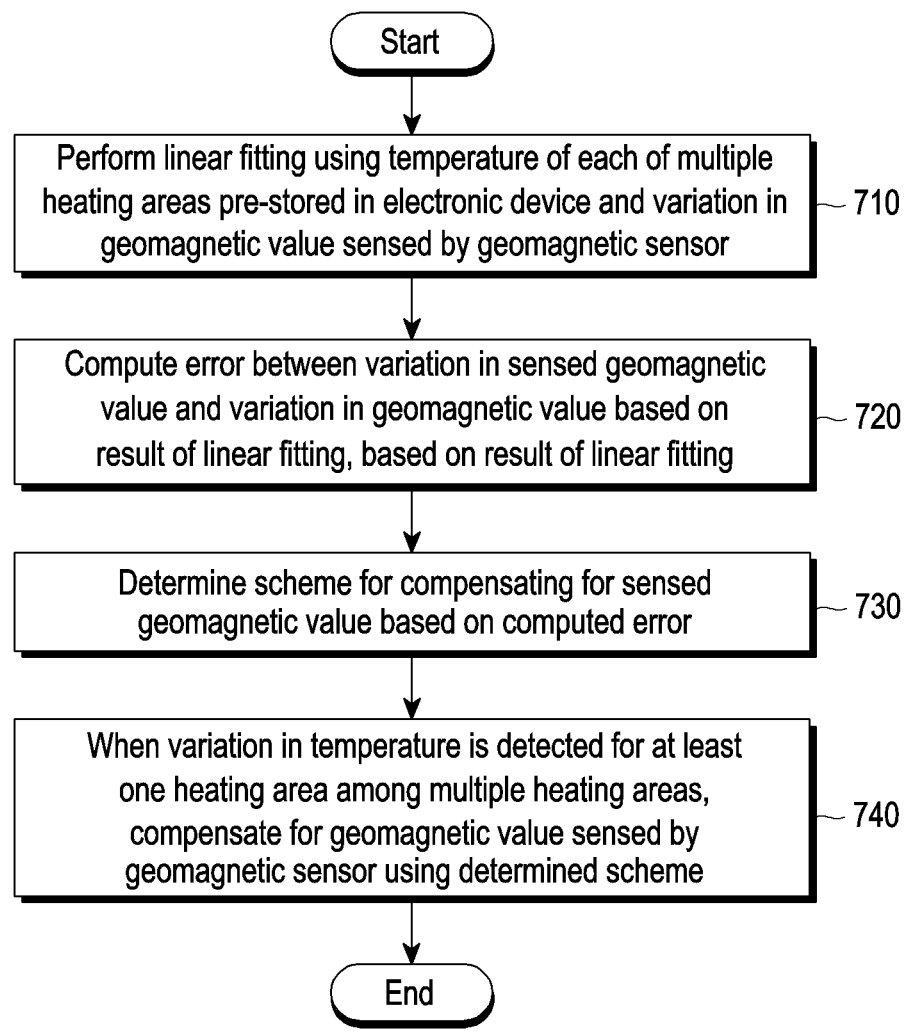
FIG. 7 is a flowchart illustrating a function or operation of compensating for a geomagnetic value using a temperature compensation table previously stored in an electronic device according to an embodiment of the disclosure.

FIG. 7 is a flowchart illustrating a function or operation of compensating for a geomagnetic value using a temperature compensation table previously stored in an electronic device 101 according to an embodiment of the disclosure.

Referring to FIG. 7, in operation 710, an electronic device 101 (e.g., the processor 120 of FIG. 1) according to an embodiment of the disclosure may perform linear fitting using variations in the geomagnetic value sensed by the geomagnetic sensor and the respective temperatures of a plurality of heating areas previously stored in the electronic device 101. FIG. 7 illustrates an example scheme (which may be referred to as a "prior measuring scheme" in the disclosure) for measuring variations in geomagnetic value while varying the temperature of a plurality of heating areas from a base temperature or initial temperature, to a maximum temperature limit that may occur when the electronic device 101 is used. By the prior measuring scheme according to an embodiment of the disclosure, the electronic device 101 may perform linear fitting using an already completed temperature compensation table. What has been described in connection with operation 220 may be applied likewise to linear fitting according to the FIG. 7 embodiment of the disclosure.

In operation 720, the electronic device 101 according to an embodiment of the disclosure may compute one or more errors between the sensed variations in geomagnetic value and the estimated values for the variations in geomagnetic value based on the result of linear fitting. The electronic device 101 according to an embodiment of the disclosure may compute the root mean squares of the differences between the sensed variations in geomagnetic value and the estimated values for the variations in geomagnetic value based on the result of linear fitting. The electronic device 101 according to an embodiment of the disclosure may compute the error a, as shown in FIG. 6, for each sample (e.g. point in time when the sample is taken) and compute the root mean square using the computed error a. The electronic device 101 according to an embodiment of the disclosure may compute the root mean square for each equation (e.g., Equation 3 and Equation 4). For example, when there are two heating areas, the electronic device 101 according to an embodiment of the disclosure may compute a root mean square for the estimated value according to Equation 3 and a root mean square for the estimated value according to Equation 4.

In operation 730, the electronic device 101 according to an embodiment of the disclosure may determine a scheme for compensating for the sensed geomagnetic value based on the computed error. The electronic device 101 according to an embodiment of the disclosure may determine an equation having the smallest value among the plurality of computed root mean squares, as the compensation equation for compensating for geomagnetic value. For example, in the case where there are two heating areas, the root mean square for the estimated value according to Equation 3 is 0.041, and the root mean square for the estimated value according to Equation 4 is 0.058, the electronic device 101 according to an embodiment of the disclosure may determine Equation 3 having the relatively smaller root mean square as the equation for compensating for geomagnetic value. For example, the electronic device 101 according to an embodiment of the disclosure may determine at least one heating area (e.g., the first heating area 310) for compensating for geomagnetic value based on the size of the root mean square. However, in another embodiment, the electronic device 101 according to an embodiment of the disclosure may compensate for the geomagnetic value using values included in the compensation table generated in operation 210 without generating and/or determining a compensation equation. For example, in the case where at least one heating area for compensating for geomagnetic value is determined as the first heating area 310, if the temperature is substantially varied (e.g., increased from 35 degrees to 36 degrees), the electronic device 101 according to an embodiment of the disclosure may compensate for the sensed geomagnetic value by subtracting 0.8, which is a value included in the compensation table, from the sensed geomagnetic value.

In operation 740, in the case where a variation in temperature is detected for at least one heating area (e.g., the first heating area 310) among the plurality of heating areas, the electronic device 101 according to an embodiment of the disclosure may compensate for the sensed geomagnetic value by the geomagnetic sensor using the equation determined in operation 240. For example, in the case where at least one heating area for compensating for the geomagnetic value is determined as the first heating area 310 (e.g., when the compensation equation is determined as Equation 3), if identifying that the temperature of the first heating area 310 is substantially varied (e.g., when the temperature of the first heating area 310 is varied from 35 degrees to 36 degrees), the electronic device 101 according to an embodiment of the disclosure may compensate for the geomagnetic value sensed by the geomagnetic sensor by subtracting the geomagnetic value $\Delta Mag_x$ (e.g., +0.79) estimated using the determined equation from the geomagnetic value actually sensed by the geomagnetic sensor. The electronic device 101 according to an embodiment of the disclosure may perform the function or operation shown in FIG. 2 and/or FIG. 7 to each axis (X axis, Y axis, and Z axis) of the geomagnetic sensor. Thus, different heating areas may be selected for each axis (e.g., a different compensation equation is determined for each axis), and the electronic device 101 according to an embodiment of the disclosure may compensate for geomagnetic value by applying different equations for each axis.

Figure 8:
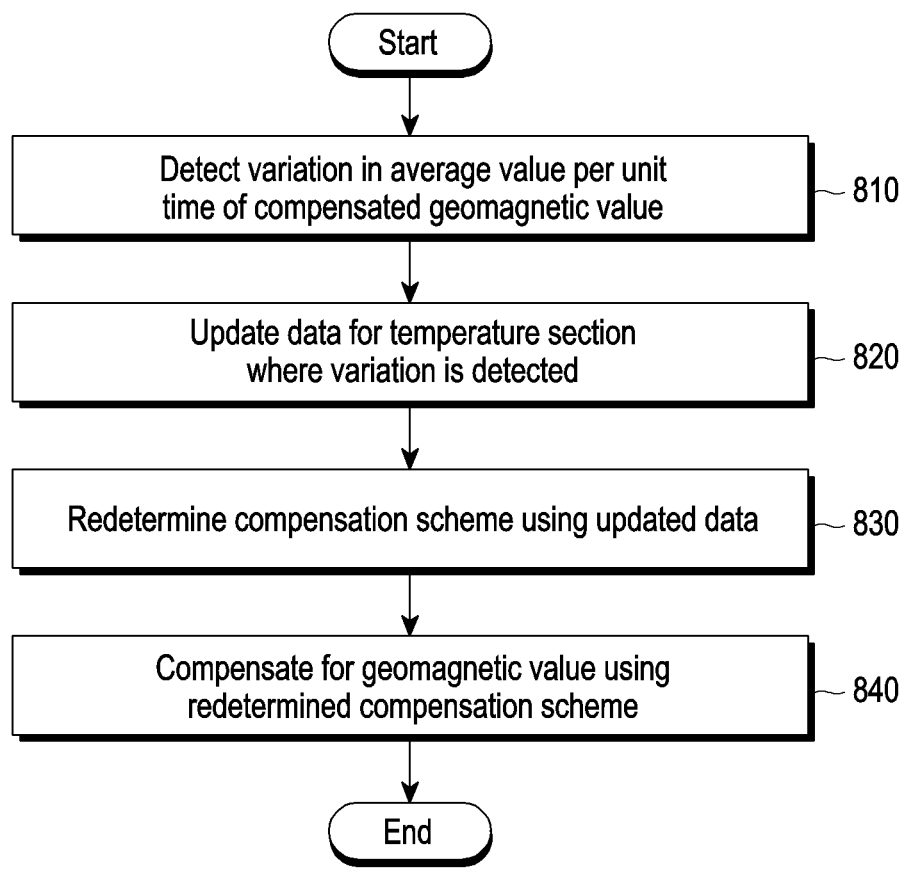
FIG. 8 is a flowchart illustrating a function or operation of updating a temperature compensation table according to an embodiment of the disclosure.

FIG. 8 is a flowchart illustrating a function or operation of updating a temperature compensation table according to an embodiment of the disclosure.

Referring to FIG. 8, in operation 810, an electronic device 101 (e.g., the processor 120 of FIG. 1) according to an embodiment of the disclosure may detect one or more variations in average value per unit time of the compensated geomagnetic value. The electronic device 101 according to an embodiment of the disclosure may detect the variations in average value per unit time of the geomagnetic value compensated for each of a plurality of temperatures included in the temperature compensation table according to a pre-designated period (e.g., a one-month interval). Operation 810 according to an embodiment of the disclosure may be performed when the electronic device 101 is in a static state. When the variation in average value per unit time of the compensated geomagnetic value is a predetermined threshold or more, the electronic device 101 according to an embodiment of the disclosure may identify that a characteristic of the electronic device 101 has been changed, or an issue has occurred with compensation.

In operation 820, the electronic device 101 according to an embodiment of the disclosure may update the data in the temperature section where a variation has been detected. For example, upon identifying that the temperature section where the variation in average value per unit time of the compensated geomagnetic value is a predetermined threshold or more is the section corresponding to 36 degrees (e.g., the section where 35 degrees change to 36 degrees), the electronic device 101 according to an embodiment of the disclosure may reperform operation 210 on the 36-degree temperature section.

In operation 830, the electronic device 101 according to an embodiment of the disclosure may redetermine the compensation scheme using the updated data. The electronic device 101 according to an embodiment of the disclosure may redetermine the compensation scheme by reperforming operations 220 to 240 using the updated data. In operation 840, the electronic device 101 according to an embodiment of the disclosure may compensate for the geomagnetic value using the compensation scheme redetermined according to operation 830.

According to an embodiment of the disclosure, an electronic device (e.g., the electronic device of FIG. 1) may comprise a memory (e.g., the memory 130 of FIG. 1), a geomagnetic sensor (e.g., the sensor module 176 of FIG. 1), and at least one processor (e.g., the processor 120 of FIG. 1) configured to store, in the memory, a temperature of each of a plurality of heating areas included in the electronic device and a variation in a geomagnetic value sensed by the geomagnetic sensor, corresponding to the temperature, perform linear fitting using the temperature and the variation in the geomagnetic value stored in the memory, compute an error between the variation in the geomagnetic value and an estimated value for the variation in the geomagnetic value, based on a result of the linear fitting, determine a scheme for compensating for the geomagnetic value based on the computed error, and compensate for the geomagnetic value sensed by the geomagnetic sensor using the determined scheme when a variation in temperature is detected for at least one heating area in the plurality of heating areas.

According to an embodiment of the disclosure, an electronic device (e.g., the electronic device of FIG. 1) may comprise a memory (e.g., the memory 130 of FIG. 1), a geomagnetic sensor (e.g., the sensor module 176 of FIG. 1), and at least one processor (e.g., the processor 120 of FIG. 1) configured to perform linear fitting using a temperature of each of a plurality of heating areas previously stored in the memory and a variation in a geomagnetic value sensed by the geomagnetic sensor, compute an error between the variation in the geomagnetic value and an estimated value for the variation in the geomagnetic value, based on a result of the linear fitting, determining a scheme for compensating for the geomagnetic value based on the computed error, and compensate for the geomagnetic value sensed by the geomagnetic sensor using the determined scheme when a variation in temperature is detected for at least one heating area in the plurality of heating areas.

The electronic device according to certain embodiments of the disclosure may be one of various types of electronic devices. The electronic devices may include, for example, a portable communication device (e.g., a smart phone), a computer device, a portable multimedia device, a portable medical device, a camera, a wearable device, or a home appliance. According to an embodiment of the disclosure, the electronic devices are not limited to those described above.

It should be appreciated that certain embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Certain embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a compiler or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to certain embodiments of the disclosure may be included and provided in a computer program product. The computer program products may be traded as commodities between sellers and buyers. The computer program product may be distributed in the form of a machine-readable storage medium (e.g., compact disc read only memory (CD-ROM)), or be distributed (e.g., downloaded or uploaded) online via an application store (e.g., Play Store™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to certain embodiments, each component (e.g., a module or a program) of the above-described components may include a single entity or multiple entities. Some of the plurality of entities may be separately disposed in different components. According to certain embodiments, one or more of the above-described components may be omitted, or one or more other components may be added. Alternatively or additionally, a plurality of components (e.g., modules or programs) may be integrated into a single component. In such a case, according to certain embodiments, the integrated component may still perform one or more functions of each of the plurality of components in the same or similar manner as they are performed by a corresponding one of the plurality of components before the integration. According to certain embodiments, operations performed by the module, the program, or another component may be carried out sequentially, in parallel, repeatedly, or heuristically, or one or more of the operations may be executed in a different order or omitted, or one or more other operations may be added.

Certain of the above-described embodiments of the present disclosure can be implemented in hardware, firmware or via the execution of software or computer code that can be stored in a recording medium such as a CD ROM, a Digital Versatile Disc (DVD), a magnetic tape, a RAM, a floppy disk, a hard disk, or a magneto-optical disk or computer code downloaded over a network originally stored on a remote recording medium or a non-transitory machine readable medium and to be stored on a local recording medium, so that the methods described herein can be rendered via such software that is stored on the recording medium using a general purpose computer, or a special processor or in programmable or dedicated hardware, such as an ASIC or FPGA. As would be understood in the art, the computer, the processor, microprocessor controller or the programmable hardware include memory components, e.g., RAM, ROM, Flash, etc. that may store or receive software or computer code that when accessed and executed by the computer, processor or hardware implement the processing methods described herein.

While the present disclosure has been shown and described with reference to various embodiments thereof, it will be understood by those skilled in the art that various changes in form and details may be made therein without departing from the present disclosure as defined by the appended claims and their equivalents.

What is claimed is:

1. An electronic device comprising:
   a memory,
   a geomagnetic sensor, and
   at least one processor configured to:
      store, in the memory, a temperature of each of a plurality of heating areas included in the electronic device and a variation in a geomagnetic value sensed by the geomagnetic sensor, corresponding to the temperature,
      perform linear fitting using the temperature and the variation in the geomagnetic value stored in the memory,
      compute an error between the variation in the geomagnetic value and an estimated value for the variation in the geomagnetic value, based on a result of the linear fitting,
      determine a scheme for compensating for the geomagnetic value based on the computed error, and
      compensate for the geomagnetic value sensed by the geomagnetic sensor using the determined scheme when a variation in temperature is detected for at least one heating area in the plurality of heating areas,
      wherein the at least one processor is further configured to, when an acceleration value sensed by the acceleration sensor is a predesignated value or less, sense the temperature and the variation in the geomagnetic value and store the temperature and the variation in the geomagnetic value in the memory.

2. The electronic device of claim 1, wherein the geomagnetic sensor includes a three-axis geomagnetic sensor, and
   wherein the at least one processor is further configured to obtain geomagnetic values for X axis, Y axis, and Z axis from the geomagnetic sensor and measure the variation in the geomagnetic value for each axis.

3. The electronic device of claim 2, wherein an equation resulting from the linear fitting has a temperature of at least one heating area in the plurality of heating areas, as a variable.

4. The electronic device of claim 2, wherein the at least one processor is further configured to perform the linear fitting on all of the X axis, the Y axis, and the Z axis.

5. The electronic device of claim 1, wherein the at least one processor is further configured to compute average values of compensated geomagnetic values and, when a difference between the average values is a predesignated threshold or more, re-sense the geomagnetic value, and update the variation in the geomagnetic value stored in the memory.

6. The electronic device of claim 1, wherein the at least one processor is further configured to store, in the memory, an average value of temperatures of the plurality of heating areas and an average value of geomagnetic values.

7. An electronic device comprising:
   a memory,
   a geomagnetic sensor, and
   at least one processor configured to:
      perform linear fitting using a temperature of each of a plurality of heating areas previously stored in the memory and a variation in a geomagnetic value sensed by the geomagnetic sensor,
      compute an error between the variation in the geomagnetic value and an estimated value for the variation in the geomagnetic value, based on a result of the linear fitting,
      determining a scheme for compensating for the geomagnetic value based on the computed error, and
      compensate for the geomagnetic value sensed by the geomagnetic sensor using the determined scheme when a variation in temperature is detected for at least one heating area in the plurality of heating areas,
      wherein the at least one processor is further configured to compute average values of compensated geomagnetic values and, when a difference between the average values is a predesignated threshold or more, re-sense the geomagnetic value, and update the variation in the geomagnetic value stored in the memory.

8. The electronic device of claim 7, wherein the geomagnetic sensor includes a three-axis geomagnetic sensor, and
   wherein the at least one processor is further configured to obtain geomagnetic values for X axis, Y axis, and Z axis from the geomagnetic sensor and measure the variation in the geomagnetic value for each axis.

9. The electronic device of claim 8, wherein an equation resulting from the linear fitting has a temperature of at least one heating area in the plurality of heating areas, as a variable.

10. The electronic device of claim 9, wherein the at least one processor is further configured to perform the linear fitting on all of the X axis, the Y axis, and the Z axis.

11. The electronic device of claim 7, wherein the at least one processor is further configured to store, in the memory, an average value of temperatures of the plurality of heating areas and an average value of geomagnetic values.

12. A method for controlling an electronic device, the method comprising:
storing, in a memory, a temperature of each of a plurality of heating areas constituting the electronic device and a variation in a geomagnetic value sensed by a geomagnetic sensor, corresponding to the temperature,
performing linear fitting using the temperature and the variation in the geomagnetic value stored in the memory,
computing an error between the variation in the geomagnetic value and an estimated value for the variation in the geomagnetic value, based on a result of the linear fitting,
determining a scheme for compensating for the geomagnetic value based on the computed error, and
compensating for the geomagnetic value sensed by the geomagnetic sensor using the determined scheme when a variation in temperature is detected for at least one heating area in the plurality of heating areas,
wherein the storing of the temperature and the variation in the geomagnetic value in the memory further comprises, when an acceleration value sensed by the acceleration sensor is a predesignated value or less, sensing the temperature and the variation in the geomagnetic value and storing the temperature and the variation in the geomagnetic value in the memory.

13. The method of claim 12, wherein the geomagnetic sensor includes a three-axis geomagnetic sensor, and
wherein the storing of the variation in the geomagnetic value sensed by the geomagnetic sensor further comprises:
obtaining geomagnetic values for X axis, Y axis, and Z axis from the geomagnetic sensor;
measuring the variation in the geomagnetic value for each axis; and
storing the measured variation in the geomagnetic value.

14. The method of claim 12, wherein an equation resulting from the linear fitting has a temperature of at least one heating area in the plurality of heating areas, as a variable.

15. The method of claim 13, wherein performing the linear fitting further includes performing the linear fitting on all of the X axis, the Y axis, and the Z axis.

16. The method of claim 12, further comprising computing average values of compensated geomagnetic values and, when a difference between the average values is a predesignated threshold or more, re-sensing the geomagnetic value, and updating the variation in the geomagnetic value stored in the memory.

17. The method of claim 12, wherein storing in the memory includes storing, in the memory, an average value of temperatures of the plurality of heating areas and an average value of geomagnetic values.

* * * * *